United States Patent
Lercel et al.

(10) Patent No.: US 7,067,220 B2
(45) Date of Patent: Jun. 27, 2006

(54) PATTERN COMPENSATION TECHNIQUES FOR CHARGED PARTICLE LITHOGRAPHIC MASKS

(75) Inventors: Michael James Lercel, Fishkill, NY (US); David Walker, Marblehead, MA (US)

(73) Assignee: International Business Machines Corporation, Armonk, NY (US)

( * ) Notice: Subject to any disclaimer, the term of this patent is extended or adjusted under 35 U.S.C. 154(b) by 192 days.

(21) Appl. No.: 10/065,963

(22) Filed: Dec. 4, 2002

(65) Prior Publication Data

US 2004/0110069 A1 Jun. 10, 2004

(51) Int. Cl.
*G03F 9/00* (2006.01)

(52) U.S. Cl. ............................ 430/5; 430/30; 430/296; 430/942

(58) Field of Classification Search .................... 430/5, 430/30, 296, 942
See application file for complete search history.

(56) References Cited

U.S. PATENT DOCUMENTS 5,942,760 A * 8/1999 Thompson et al. ...... 250/492.2
6,221,537 B1 * 4/2001 Thompson et al. ............ 430/5

* cited by examiner

*Primary Examiner*—Christopher G. Young
(74) *Attorney, Agent, or Firm*—Richard M. Kotulak

(57) ABSTRACT

A method of producing a particle beam mask and mask structures to allow for the use of dummy fill shapes. This invention overcomes distortion in by adding a dummy shape in unexposed regions and applying a blocking layer to cover the dummy shape. The blocking layer is comprised of an aperture or additional mask mounted close to the mask or can be added to the mask itself.

11 Claims, 5 Drawing Sheets

Dense half-field

PATTERN COMPENSATION TECHNIQUES FOR CHARGED PARTICLE LITHOGRAPHIC MASKS

STATEMENT REGARDING FEDERALLY SPONSORED RESEARCH

This invention was made with U.S. Government support under Agreement No. N00019-99-3-1366 awarded by the Naval air Systems Command. The U.S. Government has certain rights in the invention.

BACKGROUND OF THE INVENTION

This invention relates to masks used for charged particle lithography. It relates more specifically to electron lithography systems employing thin membrane masks used to scatter electrons.

Masks for charged particle lithography, in particular electron beam projection lithography (EPL), are formed from thin membrane masks. It has been found that if the membrane or scattering material has some intrinsic stress and is patterned, the placement of the images distorts as the stress is relieved due to removal of the stressed layers. This effect is largest when a large gradient exists in the pattern density, such as half of the membrane being patterned with a dense pattern and the other half being unpatterned. This leads to a large membrane distortion that is impossible to correct in the e-beam optics. Patterning the entire membrane also leads to a large distortion, but this can be corrected by a magnification correction in the e-beam optics.

This problem is illustrated by FIGS. 1 and 2. FIG. 1 shows a schematic of a half-patterned region on a membrane. FIG. 2 shows a corresponding image placement distortion pattern for a 1×1 mm stencil mask. See Lercel et al., J. Vac. Sci Technol. B. 19(6), pp. 2671–2677 November/December (2001) for a further explanation of pattern-induced image placement distortions.

BRIEF SUMMARY OF THE INVENTION

One way to overcome distortion in EPL is to add dummy shapes (also known as fill) in the unexposed region. This is often practiced in wafer fabrication to reduce micro-loading during etch or CMP. However, these shapes could print during the EPL exposure leading to undesirable patterning of the wafer. Alternatively, the shapes may be added only in allowable regions (those outside of the printing area), but this limits the usability of this compensation technique.

This invention describes methods of producing a mask and mask structures to allow for the use of dummy fill shapes but which will alleviate printability problems. This invention overcomes distortion in by adding a dummy shape in regions that are exposed to the electron beam and applying a blocking layer to cover the dummy shape and prevent the dummy shape from being printed on the wafer. The blocking layer is comprised of an aperture or additional mask mounted close to the mask or can be added to the mask itself.

DETAILED DESCRIPTION OF THE INVENTION

Figure 1:
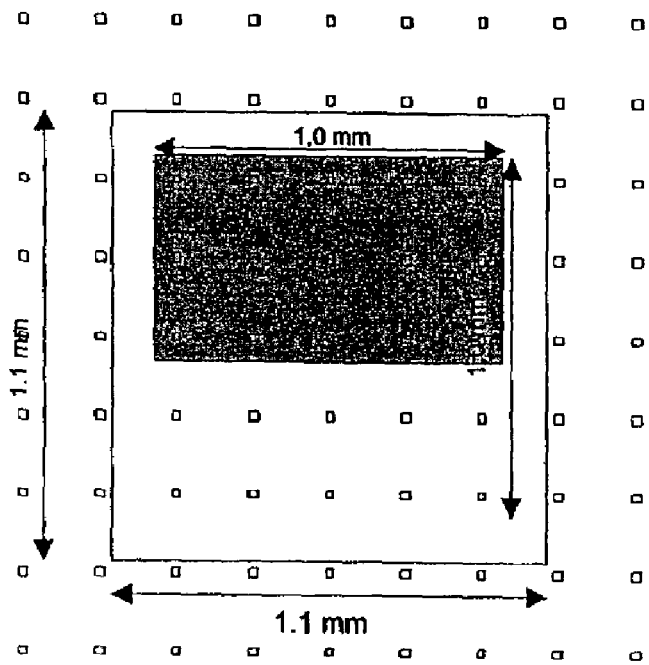
FIG. 1 shows a schematic of a half-patterned region on a membrane.
Figure 2:
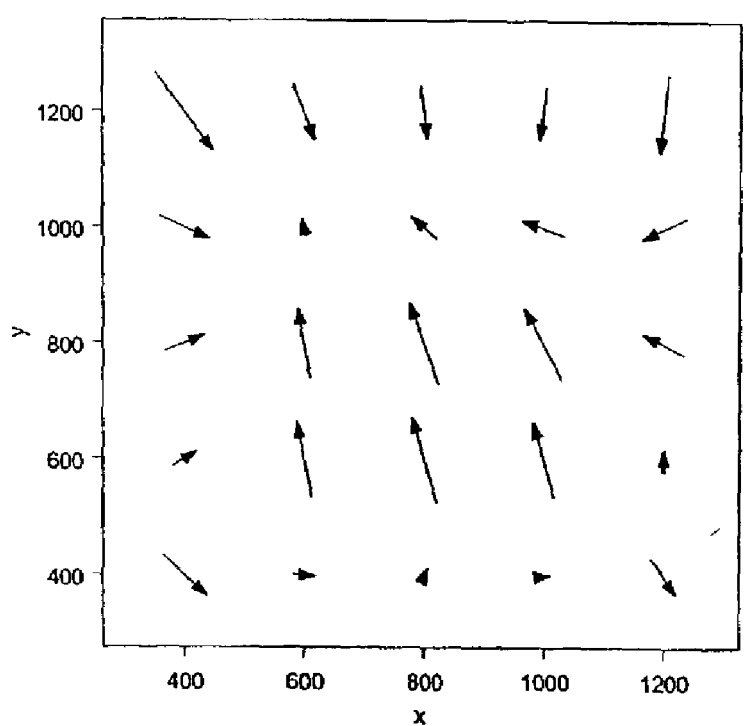
FIG. 2 shows a schematic of a distortion pattern for a 1×1 mm stencil mask induced by a half-patterned region.
Figure 3:
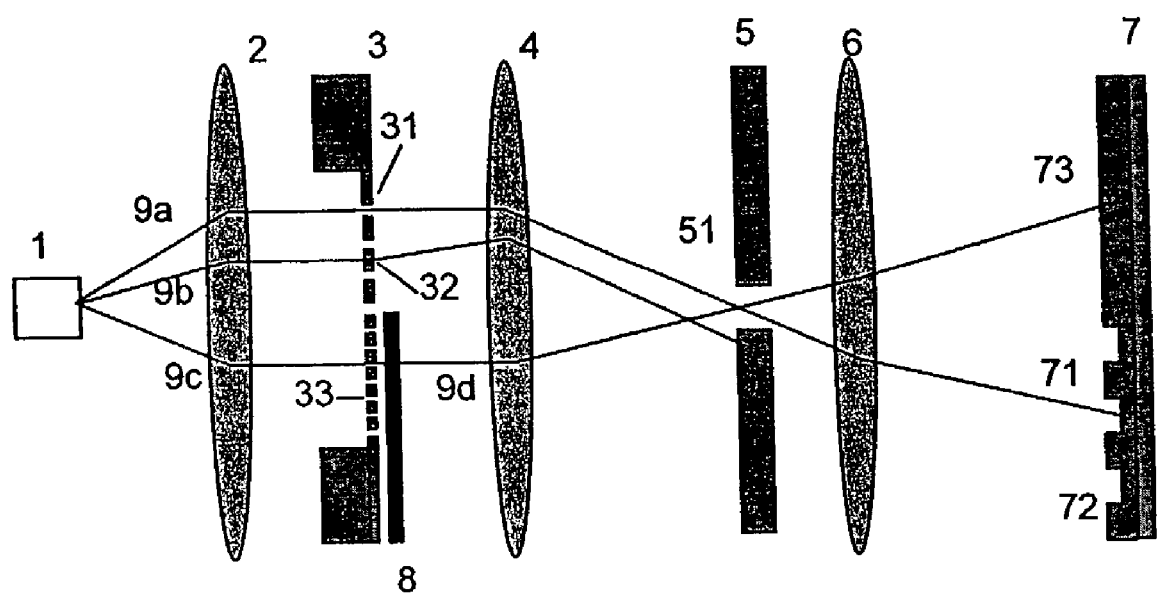
FIG. 3 illustrates in diagram form an E-beam projection system with a blocking plane.

In order to understand how this invention solves the problem of fill shapes printing on a wafer a schematic diagram of an E-beam projection system with a blocking plane is illustrated in FIG. 3. The simplified E-beam projection system and apparatus depicted in FIG. 3 has as key physical elements an electron source 1, a condenser lens 2, a scattering mask 3, an objective lens 4, a back focal plane filter 5, a projection lens 6 and target 7 carrying an electron-sensitive resist layer. Scattering mask 3 has clear regions 31 and scattering regions 32 and fill region 33. Fill region 33 is added to reduce stress and is not intended to be printed. Objective lens 4 images source 1 at aperture 51 while projection lens 6 images mask 3 at target 7.

FIG. 3 also depicts the flow of energy, identified as rays 9, for source 1 to target 7. Net energy at target 7 is depicted by exposed regions 71 and unexposed regions (no electron flux) 72. Rays passing undisturbed through mask opening 31 are identified as 9a. This electron trajectory goes through aperture 51 and exposes region 71. The electron trajectory for rays 9b go through an opaque region 32 on the mask. The electron is scattered by opaque region 32 and is absorbed by aperture S.

Rays 9c represents the electron trajectory for electrons headed for fill region 33. Normally these electrons on this trajectory would pass through region 33 and continue on trajectory 9d and expose resist at 73. However, blocking plane 8, which may be a part of or near the mask, absorbs these electrons, so they do not unintentionally expose resist on target wafer 7.

There are several ways blocking plane 8 may be formed.

Figure 4:
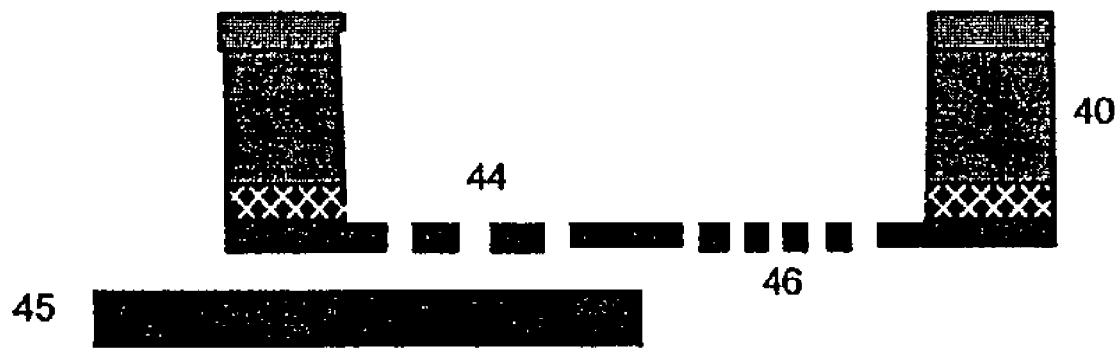
FIG. 4 illustrates in schematic diagram form the use of an aperture in the e-beam stepper below the mask that to cover regions containing fill.

FIG. 4 illustrates in schematic diagram form the use of an aperture in the e-beam stepper below the mask 40 that is to cover regions containing fill. The aperture 45 is adjustable (in both lateral dimensions) to cover the appropriate region. In FIG. 4 the fill shapes 44 are the coarser shapes on the left, and the desired device patterns 46 are on the right. The aperture 45 slides to occlude the fill shape region. Note that the aperture may be located in other locations of the e-beam column and may be fixed and the e-beam steered over the edges of the fixed aperture. Note that in this (and all figures) only a single subfield (membrane) is shown for clarity. Actual masks have a large plurality of subfields. Each subfield is printed independently, and the exposure beam is stepped from subfield to subfield. Note also that the mask is typically inverted during use in the stepper (as shown).

Figure 5:
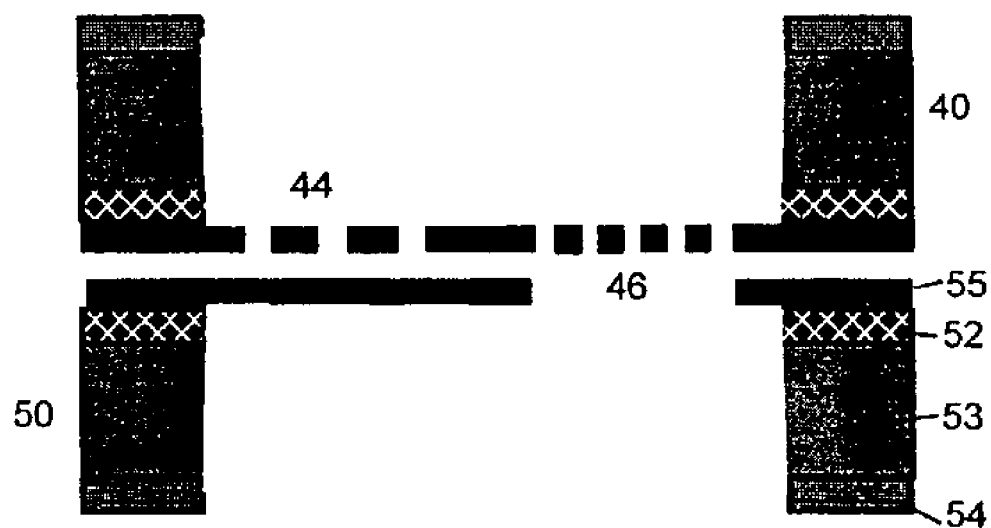
FIG. 5 illustrates in schematic diagram form the use of a coarse mask 50 that would be placed immediately above (or below) the patterning mask 40.

FIG. 5 illustrates in schematic diagram form the use of a coarse mask 50 that would be placed immediately above (or below) the patterning mask 40. This coarse mask would be opaque in the regions where fill 44 exist and clear in regions where device patterns 46 exist. The size of the compensation (fill) regions are likely to be >100 um so this coarse mask has large features and is easy to produce by inexpensive patterning methods. This allows for more general occlusion of fill patterns, i.e., ones that are located in arbitrary regions of the membrane. This requires the fabrication of a second mask (although an easy one). FIG. 5 demonstrates the concept where the top mask, with device patterns on the right and fill patterns on the left, is fabricated from an SOI mask substrate with silicon layer 55, buried oxide layer 52, substrate layer 53, and backside layer 54. The bottom mask is opaque except in the area where the device patterns are to be printed. This second mask may have the same structure (as shown in FIG. 5) or another structure.

Figure 6:
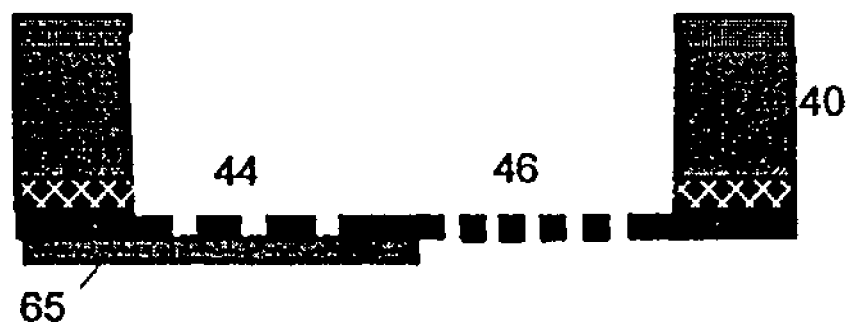
FIG. 6 illustrates in schematic diagram form a blocking layer fabricated into the scattering mask itself.

The third method shown in FIG. 6 involves depositing an opaque layer over (or under) the dummy fill structures. The opaque layer only needs to scatter the electrons enough for them to be absorbed by the aperture 5 in FIG. 3 so the opaque layer need not be completely absorbing. FIG. 6 illustrates in schematic diagram form a blocking layer fabricated into the scattering mask itself. The disadvantage of this method is the opaque layer must be of very low stress but still opaque to the high energy electronics. The layer may be deposited on the top or bottom of the mask. In FIG. 6, the opaque layer 65 is shown on the front surface of the mask over the coarse fill regions. The opaque region may be low stress silicon, SiON, silicon nitride, silicon oxide, or a metal layer. Or diamond, diamond-like carbon, or hardened polymer.

Figure 7:
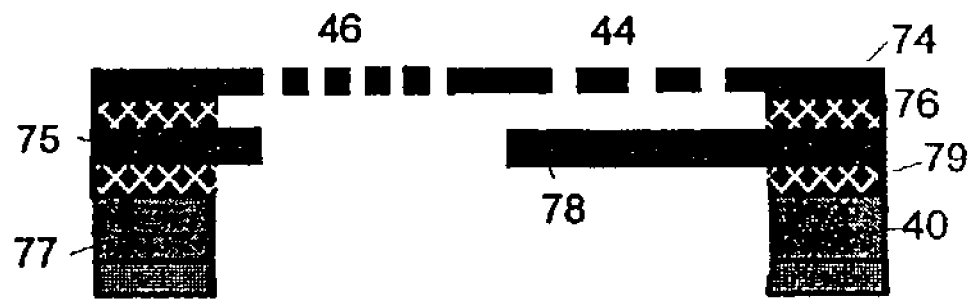
FIG. 7 illustrates in schematic diagram form the use of an alternative monolithic starting substrate.

The first three methods utilize an existing mask format. The fourth method of FIG. 7 illustrates in schematic diagram form the use of an alternative monolithic starting substrate. A mask is fabricated with multiple membrane layers. The front surface membrane 74 is patterned with the device and fill structures. A second membrane 75 is patterned with the desired opaque regions 78 to block the fill structures. One embodiment of this invention is shown in FIG. 7. A typical silicon-on-insulator starting substrate of silicon membrane layer 74, buried oxide layer 76, and silicon substrate 77 is modified by the addition of a second SOI layer formed from a second silicon membrane layer 75 and buried oxide layer 79. The starting substrate would be formed with standard SOI fabrication techniques of wafer bonding and release as are well known in the art. The use of a SOI layer as a starting substrate is desirable because of film stress control, but alternative techniques of forming this substrate are within the spirit of the invention. For example, the buried oxide layers and silicon layers could be formed by chemical vapor deposition. The mask blank would be fabricated by standard techniques by etching the substrate 77 and stopping on the buried oxide 79. The mask would be patterned by normal processes to form the desired device patterns 46 (in FIG. 7 the mask is shown front surface up) and fill patterns 44 (on the right) in silicon layer 74, stopping on buried oxide 76. The back of the mask would then be patterned with the coarse opaque blocking region 76 over the fill patterns into silicon membrane layer 75 (note that buried oxide layer 79 would be removed first). Then the buried oxide layer 76 would be removed using standard oxide removal techniques to form the mask structure as shown (the oxide would not need to be removed entirely from under the fill shapes).

Figure 8:
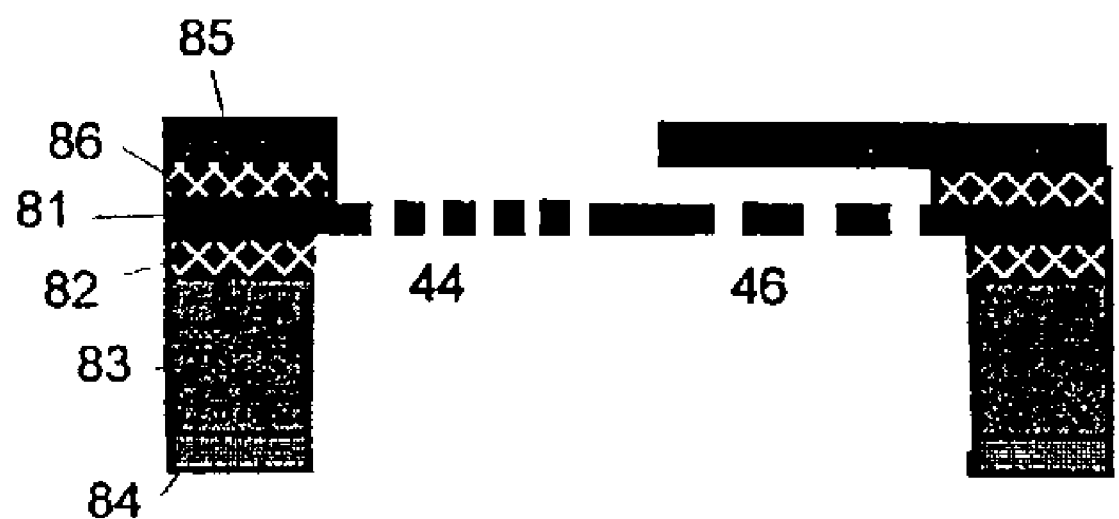
FIG. 8 illustrates in schematic diagram form a method of fabricating a structure similar to the of FIG. 7 from a standard stencil mask substrate.

FIG. 8 illustrates in schematic diagram form a method of fabricating a structure similar to that of FIG. 7 from a standard stencil mask substrate. After the stencil mask of layers 81–84 is formed by standard techniques. A thin layer 86, such as low stress SiON, $SiO_2$, or a polymer, is deposited over the finished mask. Subsequently an electron opaque layer 85, such as silicon, is deposited over layer 86. The opaque layer 85 is coarsely patterned to block the fill shapes. The layer 86 is removed from the membrane area such as through a wet chemical etch of the SiON, $SiO_2$, or polymer to leave a free-standing opaque blocking membrane formed from layer 85. The support layer 86 would not have to be removed from the fill region 46, but would advantageously be removed to eliminate extra stress on the device patterned layer 81.

What is claimed is:

1. A method for reducing distortion in charged particle lithographic masks, comprising the steps of:
   adding a dummy fill shape in an unexposed region of a mask; and
   applying a blocking layer to a region of the dummy fill shape so as to prevent the printing of the dummy fill shape.

2. The method of claim 1 wherein the blocking layer is an aperture.

3. The method of claim 2 where the step of applying further comprises sliding an aperture over the dummy shape.

4. The method of claim 2 wherein the aperture is adjustable.

5. The method of claim 1 where the step of applying blocking layer occurs by using a second mask with an opaque region where the dummy fill shape is.

6. The method of claim 1 where the step of applying the blocking layer occurs by depositing a low stress material that covers the dummy fill shape.

7. The method of claim 1 where the step of applying the blocking layer occurs by forming a second membrane layer on the mask and patterning the membrane.

8. The method of claim 7 wherein the blocking layer is created by using a SOI starting substrate.

9. The method of claim 1 where the step of applying the blocking layer occurs after a stencil mask is fabricated.

10. The method of claim 9 where the blocking layer is fabricated by first applying thin support layer over the stencil mask.

11. The method of claim 1 wherein the blocking layer is fabricated on a stencil mask.

* * * * *